US008895970B2

(12) United States Patent
Kim et al.

(10) Patent No.: US 8,895,970 B2
(45) Date of Patent: Nov. 25, 2014

(54) ORGANIC LIGHT-EMITTING DISPLAY DEVICE AND METHOD OF MANUFACTURING THE SAME

(71) Applicant: Samsung Display Co., Ltd., Yongin (KR)

(72) Inventors: Sung-Ho Kim, Yongin (KR); Min-Chul Shin, Yongin (KR); Do-Young Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/673,722

(22) Filed: Nov. 9, 2012

(65) Prior Publication Data
US 2014/0027720 A1    Jan. 30, 2014

(30) Foreign Application Priority Data

Jul. 26, 2012  (KR) .................. 10-2012-0081972

(51) Int. Cl.
*G09G 3/10*    (2006.01)
*H01L 27/32*   (2006.01)
*H01L 51/00*   (2006.01)

(52) U.S. Cl.
CPC ........ *H01L 27/3225* (2013.01); *H01L 51/0023* (2013.01); *H01L 51/00* (2013.01); *H01L 27/3223* (2013.01)
USPC ...... 257/40; 257/E51.019; 257/48; 315/169.3

(58) Field of Classification Search
USPC .......................... 257/40, 48, 59, 72
See application file for complete search history.

(56) References Cited

U.S. PATENT DOCUMENTS

| 7,875,880 B2* | 1/2011 | Lee .............................. 257/40 |
| 2005/0258486 A1 | 11/2005 | Yoon |
| 2008/0237585 A1* | 10/2008 | Kim ............................. 257/40 |
| 2009/0153173 A1* | 6/2009 | Arasawa et al. .............. 324/763 |
| 2011/0017999 A1* | 1/2011 | Choi ............................ 257/72 |
| 2011/0108848 A1* | 5/2011 | Lee et al. ...................... 257/72 |
| 2011/0237044 A1* | 9/2011 | Yun .............................. 438/381 |

FOREIGN PATENT DOCUMENTS

| KR | 10-1996-0014647 | 10/1996 |
| KR | 10-0669742 | 1/2007 |
| KR | 10-0711883 | 4/2007 |

* cited by examiner

*Primary Examiner* — Cuong Q Nguyen
*Assistant Examiner* — Nishath Yasmeen
(74) *Attorney, Agent, or Firm* — Robert E. Bushnell, Esq.

(57) ABSTRACT

An organic light-emitting display device and a method of manufacturing the same. The organic light-emitting display device includes: an active layer that is formed by patterning a semiconductor layer formed by laser crystallization; a gate electrode that is disposed to correspond to a channel area of the active layer; a first insulating layer that is disposed between the active layer and the gate electrode; a second insulating layer that is disposed on the gate electrode; and first test patterns that are formed on the second insulating layer and contact source and drain regions of the active layer and the gate electrode, respectively.

15 Claims, 14 Drawing Sheets

ORGANIC LIGHT-EMITTING DISPLAY DEVICE AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on the 26 Jul. 2012 and there duly assigned Serial No. 10-2012-0081972.

BACKGROUND OF THE INVENTION

1. Field of the Invention

One or more embodiments of the present invention relate to an organic light-emitting display device and a method of manufacturing the same.

2. Description of the Related Art

As the information society has been developed, various types of display devices are required, and flat panel display devices, such as liquid crystal display (LCD) devices, organic electroluminescent display devices, plasma display panel (PDP) devices, field emission display devices, or the like, have been widely developed. Active matrix type flat panel display devices in which a plurality of pixels are arranged in the form of a matrix are mainly used. The pixel includes thin film transistors (TFTs) that are switching elements and drives the TFTs individually.

Each TFT includes an active layer formed of a semiconductor material, such as silicon. Hydrogenated amorphous silicon (a-Si:H) may be formed on a large substrate, such as a low-cost glass substrate, at a low temperature, and a process of forming amorphous silicon (a-Si:H) is simple and thus is widely used.

However, TFTs using hydrogenated amorphous silicon (a-Si:H) have low field effect mobility and low response speeds, and in particular, it is difficult to perform high-speed driving on TFTs using hydrogenated amorphous silicon (a-Si:H) on the large substrate.

Thus, display devices that employ TFTs using polycrystalline silicon, have been widely studied and developed. In display devices using polycrystalline silicon, TFTs in pixel areas and circuits for driving the TFTs may be formed on the same substrate, and a process of connecting TFTs in pixel areas and circuits for driving the TFTs is not required so that the entire process is simplified. In addition, polycrystalline silicon has relatively high field effect mobility that is 100 to 200 times than that of hydrogenated amorphous silicon (a-Si:H) and thus has high response speeds and has high stability with respect to temperature and light.

In addition, as display devices are gradually souped-up, strict management of device characteristics is required. The management of device characteristics is necessary for quality control, early discovery of a defective substrate, and prevention of process disclosure of the defective substrate.

SUMMARY OF THE INVENTION

One or more embodiments of the present invention provide an organic light-emitting display device that includes thin film transistors (TFTs) using polycrystalline silicon and has pixels with an improved structure in which unevenness formed by laser crystallization may be easily detected and a method of manufacturing the organic light-emitting display device.

According to an aspect of the present invention, there is provided an organic light-emitting display device including: an active layer that is formed by patterning a semiconductor layer formed by laser crystallization; a gate electrode that is disposed to correspond to a channel area of the active layer; a first insulating layer that is disposed between the active layer and the gate electrode; a second insulating layer that is disposed on the gate electrode; and first test patterns that are formed on the second insulating layer and contact source and drain regions of the active layer and the gate electrode, respectively.

The organic light-emitting display device may further include: a third insulating layer which is disposed on the second insulating layer by covering the first test patterns and in which holes for exposing parts of the first test patterns are formed; an intermediate layer formed in the holes; and an electrode layer formed on the intermediate layer. The intermediate layer may have a structure in which functional layers, excluding an emissive layer (EML), are stacked as a single layer or layers.

The organic light-emitting display device may further include a pixel electrode that is formed on the first insulating layer and is covered by the third insulating layer.

The organic light-emitting display device may further include: a capacitor lower electrode that is formed by patterning the semiconductor layer on a same layer as the active layer; and a capacitor upper electrode that is formed on the first insulating layer and is covered by the third insulating layer.

The organic light-emitting display device may further include second test patterns that are formed on the second insulating layer and contact part of the capacitor lower electrode and part of an electrode layer that contacts the capacitor upper electrode, respectively, wherein the third insulating layer includes holes through which parts of the second test patterns are exposed, and the intermediate layer and the electrode layer are sequentially stacked in the holes.

The third insulating layer may include holes through which parts of the capacitor lower electrode and part of the capacitor upper electrode are exposed, and the intermediate layer and the electrode layer are sequentially stacked in the holes.

According to another aspect of the present invention, there is provided an organic light-emitting display device including: available pixels each including a first active layer formed by patterning a semiconductor layer formed by laser crystallization, a first gate electrode disposed to correspond to a channel area of the first active layer, and source or drain electrodes that contact source and drain regions of the first active layer, respectively; and dummy pixels disposed around the available pixels, wherein the dummy pixels each include a second active layer formed by patterning the semiconductor layer, a second gate electrode disposed to correspond to a channel area of the second active layer, and first test patterns that contact source and drain regions of the second active layer and the second gate electrode, respectively.

The organic light-emitting display device may further include: a first insulating layer that is disposed between the first active layer and the first gate electrode and between the second active layer and the second gate electrode; a second insulating layer that is disposed between the first gate electrode and the source or drain electrodes and between the second gate electrode and the first test patterns; and a third insulating layer which is disposed on the second insulating layer by covering the source or drain electrodes and the first test patterns and in which holes are formed to expose parts of the first test patterns.

The organic light-emitting display device may further include: an intermediate layer that is formed on the third insulating layer; and an electrode layer that is formed on the intermediate layer.

Each of the available pixels may further include a first pixel electrode that is formed on the first insulating layer, and in the available pixels, the intermediate layer and the electrode layer may be sequentially formed on the first pixel electrode that is exposed by patterning the third insulating layer, and each of the dummy pixels may further include a second pixel electrode that is formed on the first insulating layer and is covered by the third insulating layer.

The intermediate layer formed on the available pixels may have a structure in which an emissive layer (EML) and functional layers are stacked as a single layer or layers, and the intermediate layer formed on the dummy pixels may have a structure in which functional layers, excluding the EML, are stacked as a single layer or layers.

Each of the available pixels may further include a first capacitor lower electrode that is formed by patterning the semiconductor layer on a same layer as the first active layer and a first capacitor upper electrode that is formed on the first insulating layer and is covered by the third insulating layer, and each of the dummy pixels may further include a second capacitor lower electrode that is formed by patterning the semiconductor layer on a same layer as the second active layer and a second capacitor upper electrode that is formed on the first insulating layer and is covered by the third insulating layer.

The organic light-emitting display device may further include second test patterns that are formed on the second insulating layer and contact part of the second capacitor lower electrode and part of an electrode layer that contacts the second capacitor upper electrode, respectively, wherein the third insulating layer includes holes through which parts of the second test patterns are exposed, and the intermediate layer and the electrode layer are sequentially stacked in the holes.

The third insulating layer may include holes through which parts of the second capacitor lower electrode and part of the second capacitor upper electrode are exposed, and the intermediate layer and the electrode layer may be sequentially stacked in the hole.

According to another aspect of the present invention, there is provided a method of manufacturing an organic light-emitting display device, the method including: forming an active layer by patterning a semiconductor layer that is formed by laser crystallization; forming a first insulating layer on the active layer; forming a gate electrode on the first insulating layer so as to correspond to a channel area of the active layer; forming a second insulating layer on the gate electrode; and forming first test patterns on the second insulating layer so as to contact source and drain regions of the active layer and the gate electrode, respectively.

The method may further include: forming a third insulating layer on the second insulating layer by covering the first test patterns and forming holes through which parts of the first test patterns are exposed; forming an intermediate layer in the holes; and forming an electrode layer on the intermediate layer.

The intermediate layer may have a structure in which functional layers, excluding an emissive layer (EML), are stacked as a single layer or layers.

The forming of the active layer may include forming a capacitor lower electrode by patterning the semiconductor layer, and the forming of the gate electrode may include forming an electrode pattern including a first electrode layer and a second electrode layer on the first electrode layer on the first insulating layer, and the forming of the first test patterns may include forming second test patterns that contact the capacitor lower electrode and the second electrode layer, and the forming of the holes may include forming holes through which parts of the second test patterns are exposed and sequentially forming an intermediate layer and an electrode layer in the holes.

The forming of the active layer may include forming a capacitor lower electrode by patterning the semiconductor layer, and the forming of the gate electrode may include forming an electrode pattern including a first electrode layer and a second electrode layer on the first electrode layer on the first insulating layer, and the forming of the first test patterns may include forming a capacitor upper electrode by removing part of the second electrode layer, and the forming of the holes may include forming holes through which parts of the capacitor lower electrode and the capacitor upper electrode are exposed and sequentially forming an intermediate layer and an electrode layer in the hole.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
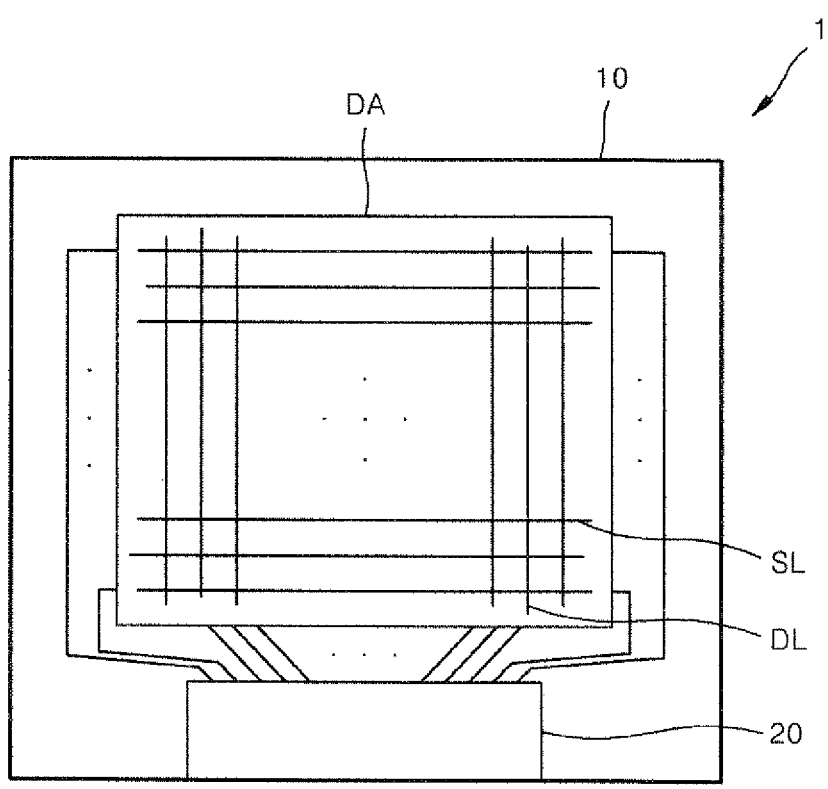
FIG. 1 is a schematic plan view of an organic light-emitting display device according to an embodiment of the present invention.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

While such terms as "first," "second," etc., may be used to describe various components, such components must not be limited to the above terms. The above terms are used only to distinguish one component from another. For example, a first component may be referred to as a second component, and likewise, a second component may be referred to as a first component without departing from the scope of the invention.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A structure and an operation of the present invention will now be described more fully with reference to the accompanying drawings, in which exemplary embodiments of the invention are shown.

Figure 2:
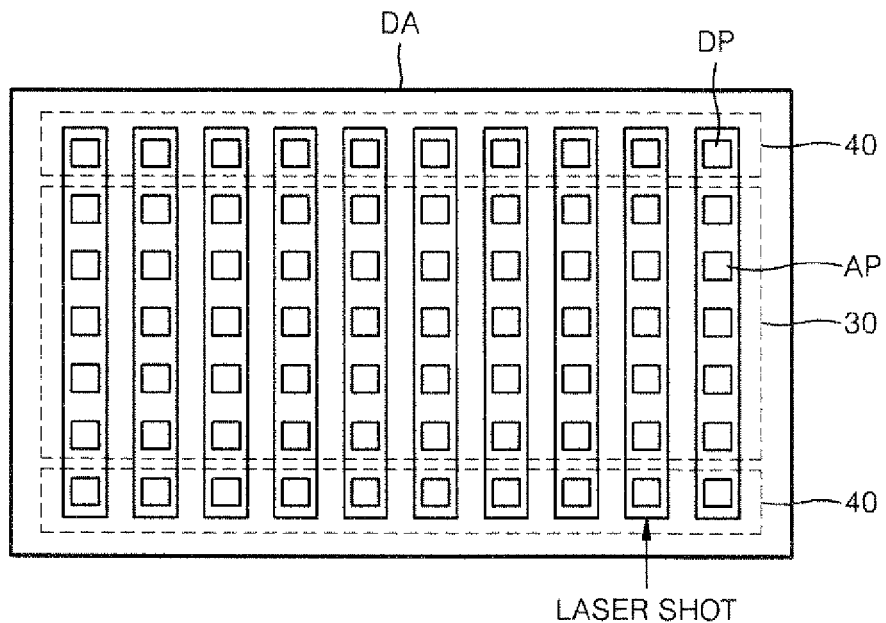
FIG. 2 is a schematic plan view of a display area of the organic light-emitting display device illustrated in FIG. 1.

FIG. 1 is a schematic plan view of an organic light-emitting display device 1 according to an embodiment of the present invention, and FIG. 2 is a schematic plan view of a display area DA of the organic light-emitting display device 1 illustrated in FIG. 1.

Referring to FIGS. 1 and 2, the organic light-emitting display device 1 according to the present embodiment includes a plurality of pixels including thin film transistors (TFTs), organic electroluminescent (EL) devices, and capacitors Csts, which are disposed on a substrate 10 that is an array substrate.

The substrate 10 that is an array substrate includes a display area DA connected to an integrated circuit (IC) 20. The display area DA includes a plurality of scan lines SL and a plurality of data lines DL, and the pixels arranged where the plurality of scan lines SL cross with the plurality of data lines DL.

The display area DA includes an active area 30 in which available pixels AP for displaying an image by light emission are arranged in the form of a matrix, and dummy areas 40 in which dummy pixels DP are arranged around the available pixels AP so as to measure precise characteristics of the TFTs and/or the capacitors Cst of the active area 30. The available pixels AP and the dummy pixels DP each include a pixel electrode, a TFT, a capacitor Cst, and wirings, and the dummy pixels DP are insulated from a driving circuit.

In the case of a display device that employs TFTs using polycrystalline silicon, polycrystalline silicon is formed by forming an amorphous silicon layer and by polycrystallizing the amorphous silicon layer. In general, polycrystalline silicon may be formed by thermally treating amorphous silicon by using a laser annealing process using an excimer laser. It should be understood that reference to an amorphous silicon layer may refer to the use of either a non-hydrogenated amorphous silicon (a-Si) or a hydrogenated amorphous silicon (a-Si:H).

Figure 3:
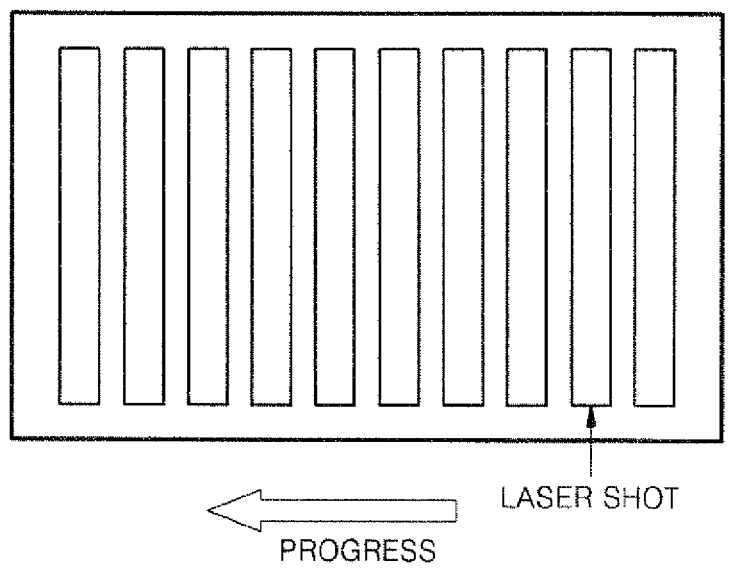
FIG. 3 illustrates a traveling direction of laser beams when a laser annealing process according to the related art is performed.

FIG. 3 illustrates a traveling direction of laser beams when a laser annealing process according to the related art is performed. As illustrated in FIG. 3, since, in the laser annealing process, laser beams are gradually scanned across the surface of the substrate via several shots, the laser annealing process has disadvantages that the speed of performing the laser annealing process is relatively low and polycrystalline silicon layers are not uniformly formed according their locations due to a difference in energy between shots of the laser beams. Thus, when light is emitted from an organic light-emitting display panel, vertical or horizontal smears are formed due to crystallization.

In the present embodiment, in order to monitor a difference in electrical characteristics in areas in which smears are formed due to crystallization, the dummy pixels DP are formed in crystallization lines, respectively, and characteristics of the TFTs and the capacitors Cst in the active area 30 may be inferred and interpreted using checking characteristics of the TFT and capacitor Cst of each dummy pixels DP. The dummy pixels DP may be formed on at least one end, or both ends, of the crystallization lines corresponding to the shots of the laser beams.

FIG. 2 illustrates an example in which the dummy pixels DP are formed on both ends of the crystallization lines. In the present embodiment, when laser annealing is performed, characteristics of TFTs and capacitors Csts according to the shots of the laser beams may be monitored as characteristics in an actual emission area. Thus, the factors leading to defects of the organic light-emitting display device 1 of FIG. 1 may be analyzed.

In order to check characteristics of the TFTs and the capacitors Csts, a test element group (TEG) including test elements may be formed on the substrate 10 that is an array substrate, and a probe may contact each of the test elements, thereby measuring characteristics of each test element.

Various driving circuits, wirings, and the like may be disposed in non-display areas around the display area DA so as to supply image signals to the available pixels AP. The driving circuits refer to all circuits in which a semiconductor device that supplies and controls electrical signals for driving the organic light-emitting display panel to perform a predetermined function and related wirings are integrated and disposed. For example, the driving circuits may be a scan circuit for transmitting scan signals to the scan lines SL of the display area DA, a data circuit for transmitting data signals to the data lines DL of the display area DA, and a driving power supply voltage wiring unit for supplying a driving power supply voltage to the display area DA, and the like. The scan circuit and the data circuit may be formed as integrated circuit (IC) 20.

FIGS. 4 through 10 are schematic cross-sectional views of a method of manufacturing an organic light-emitting display device, according to an embodiment of the present invention. In the present embodiment, processes of manufacturing available pixels AP and dummy pixels DP will be described together.

Figure 4:
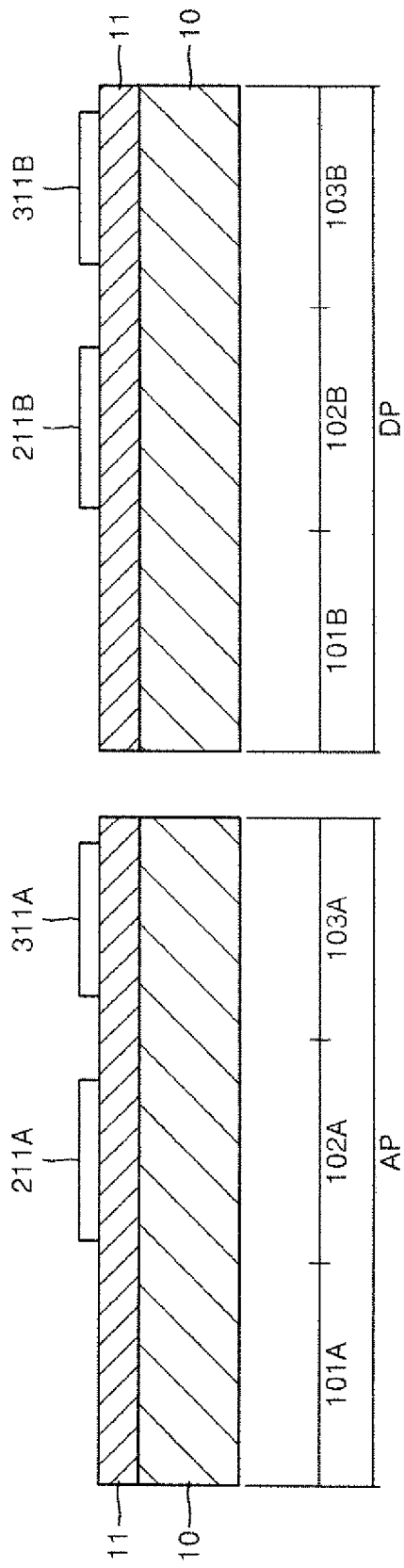
FIGS. 4 through 10 are schematic cross-sectional views of a method of manufacturing an organic light-emitting display device, according to an embodiment of the present invention.

Referring to FIG. 4, each of the available pixels AP includes a first emission area 101A in which a first organic electroluminescent device (EL1, FIG. 10) is formed, a first channel area 102A in which a first thin film transistor (TFT1, FIG. 10) is formed, and a first storage area 103A in which a first capacitor (Cst1, FIG. 10) is formed.

Each of the dummy pixels DP includes a second emission area 101B in which a second organic electroluminescent device (EL2, FIG. 10) is formed, a second channel area 102B in which a second thin film transistor (TFT2, FIG. 10) is formed, and a second storage area 103B in which a second capacitor (Cst2, FIG. 10) is formed. The second thin film transistor (TFT2) is a measuring TFT for monitoring characteristics.

Referring to FIG. 4, first, a buffer layer 11 is formed on the substrate 10 that is an array substrate.

Next, in the case of the available pixels AP, a first active layer 211A of the first channel area 102A and a first capacitor lower electrode 311A of the first storage area 103A are formed on the buffer layer 11. In the case of the dummy pixels DP, a second active layer 211B of the second channel area 102B and a second capacitor lower electrode 311B of the second storage area 103B are formed on the buffer layer 11.

The substrate 10 may be formed of a transparent glass material containing $SiO_2$ as a main component. Aspects of the present invention are not limited thereto, and the substrate 10 may be formed of various materials including transparent plastic, metal, and the like.

The buffer layer 11 prevents impurity ions from penetrating into the substrate 10, prevents moisture or air from penetrating into the substrate 10, and functions as a barrier layer and/or blocking layer for planarizing the surface of the substrate 10. The buffer layer 11 may be formed using various methods, such as plasma-enhanced chemical vapor deposition (PECVD), atmospheric pressure CVD (APCVD), and low pressure CVD (LPCVD) by using $SiO_2$ and/or SiNx.

Although not shown, after a semiconductor layer is deposited on the buffer layer 11 and a photoresist is coated on the semiconductor layer, the semiconductor layer is patterned using a photolithography process using a mask so that the first active layer 211A, the second active layer 211B, the first capacitor lower electrode 311A, and the second capacitor lower electrode 311B may be simultaneously formed. Here, the semiconductor layer is formed by crystallizing amorphous silicon by using excimer laser annealing (ELA). The crystallization process may be performed by gradually scanning laser beams across the surface of the substrate 10 via several shots and annealing.

The mask process by photolithography is performed through a series of processes, such as developing, etching, and stripping or ashing after exposure is performed on a mask by an exposure device.

Figure 5:
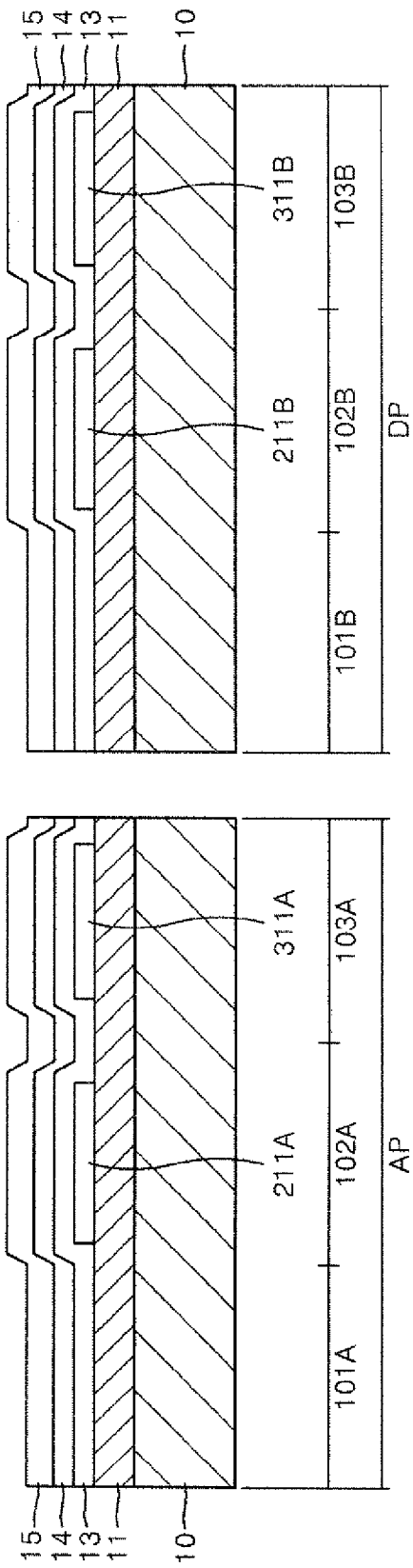

Next, referring to FIG. 5, a first insulating layer 13, a first conductive layer 14, and a second conductive layer 15 are sequentially deposited on the entire surface of the substrate 10 on which the active layer 211A, the second active layer 211B, the first capacitor lower electrode 311A, and the second capacitor lower electrode 311B are formed.

The first insulating layer 13 may be formed by depositing an inorganic insulating layer, such as SiNx or SiOx, by using methods, such as PECVD, APCVD, and LPCVD. The first insulating layer 13 functions as a gate insulating layer of the first thin film transistor TFT1 and the second thin film transistor TFT2 and as a dielectric layer of the first capacitor Cst1 and the second capacitor Cst2.

The first conductive layer 14 may include at least one material selected from the group consisting of indium tin oxide (ITO), indium zinc oxide (IZO), zinc oxide (ZNO), indium oxide ($In_2O_3$), indium gallium oxide (IGO), and aluminum zinc oxide (AZO).

The second conductive layer 15 may include at least one material selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) and may be formed as a single layer or layers.

Figure 6:
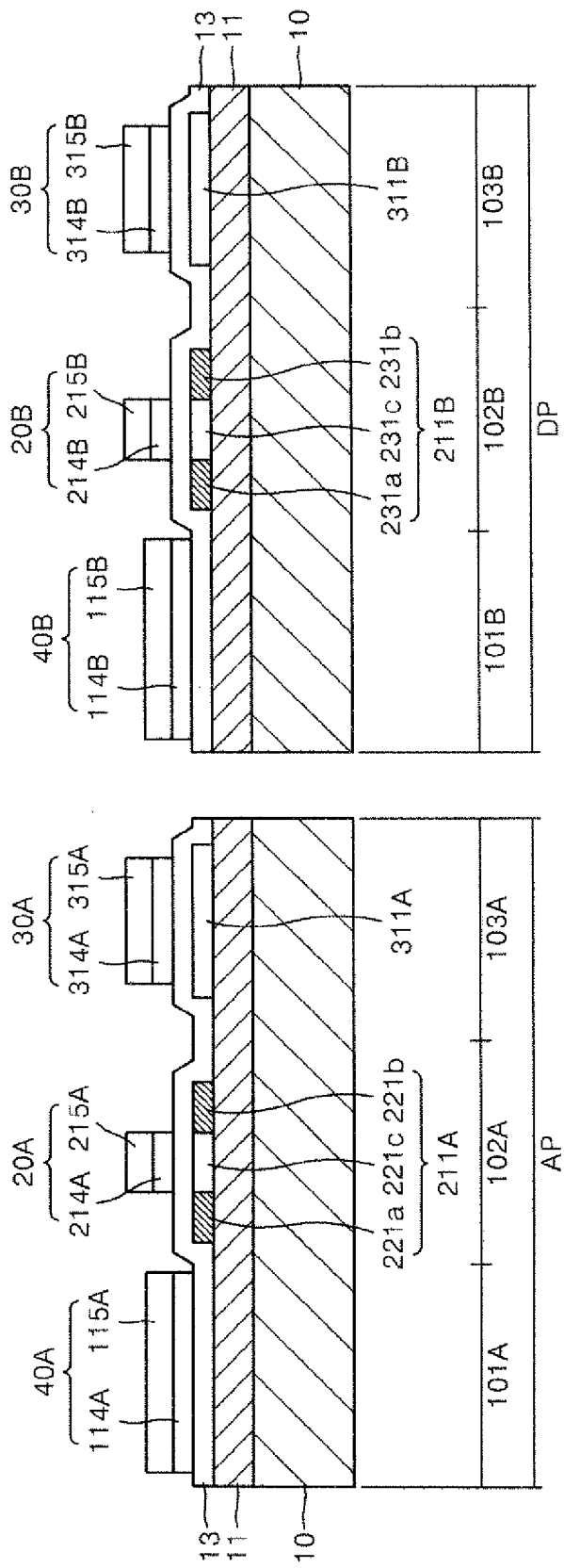

Referring to FIG. 6, the first conductive layer 14 and the second conductive layer 15 that are sequentially deposited on the entire surface of the substrate 10, are patterned by a mask processing using a mask (not shown).

An electrode pattern 40A is formed on the first insulating layer 13 in the first emission area 101A. The electrode pattern 40A includes a first pixel electrode 114A that is formed from part of the first conductive layer 14 and a first metal layer 115A that is formed from part of the second conductive layer 15. An electrode pattern 40B is formed on the first insulating layer 13 in the second emission area 101B. The electrode pattern 40B includes a second pixel electrode 114B that is formed from part of the first conductive layer 14 and a second metal layer 115B that is formed from part of the second conductive layer 15.

A first gate electrode 20A is formed on the first active layer 211A in the first channel area 102A. The first gate electrode 20A includes a first electrode 214A that is formed from part of the first conductive layer 14 and a second electrode 215A that is formed from part of the second conductive layer 15. A second gate electrode 20B is formed on the second active layer 211B in the second channel area 102B. The second gate electrode 20B includes a first electrode 214B that is formed from part of the first conductive layer 14 and a second electrode 215B that is formed from part of the second conductive layer 15.

An electrode pattern 30A is formed above the first capacitor lower electrode 311A on the first insulating layer 13 in the first storage area 103A. The electrode pattern 30A includes a first electrode layer 314A that is formed from part of the first conductive layer 14 and a second electrode layer 315A that is formed from part of the second conductive layer 15. An electrode pattern 30B is formed above the second capacitor lower electrode 311B on the first insulating layer 13 in the second storage area 103B. The electrode pattern 30B includes a first electrode layer 314B that is formed from part of the first conductive layer 14 and a second electrode layer 315B that is formed from part of the second conductive layer 15.

The first gate electrode 20A corresponds to a center of the first active layer 211A, and source/drain regions 221a and 221b are formed at edges of the first active layer 211A corresponding to both sides of the first gate electrode 20A by doping the first active layer 211A with n-type or p-type impurities by using the first gate electrode 20A as a self-alignment mask, and a channel region 221c is formed between the source/drain regions 221a and 221b. The second gate electrode 20B corresponds to a center of the second active layer 211B, and source/drain regions 231a and 231b are formed at edges of the second active layer 211B corresponding to both sides of the second gate electrode 20B by doping the second active layer 211B with n-type or p-type impurities by using the second gate electrode 20B as a self-alignment mask, and a channel region 231c is formed between the source/drain regions 231a and 231b.

Figure 7:
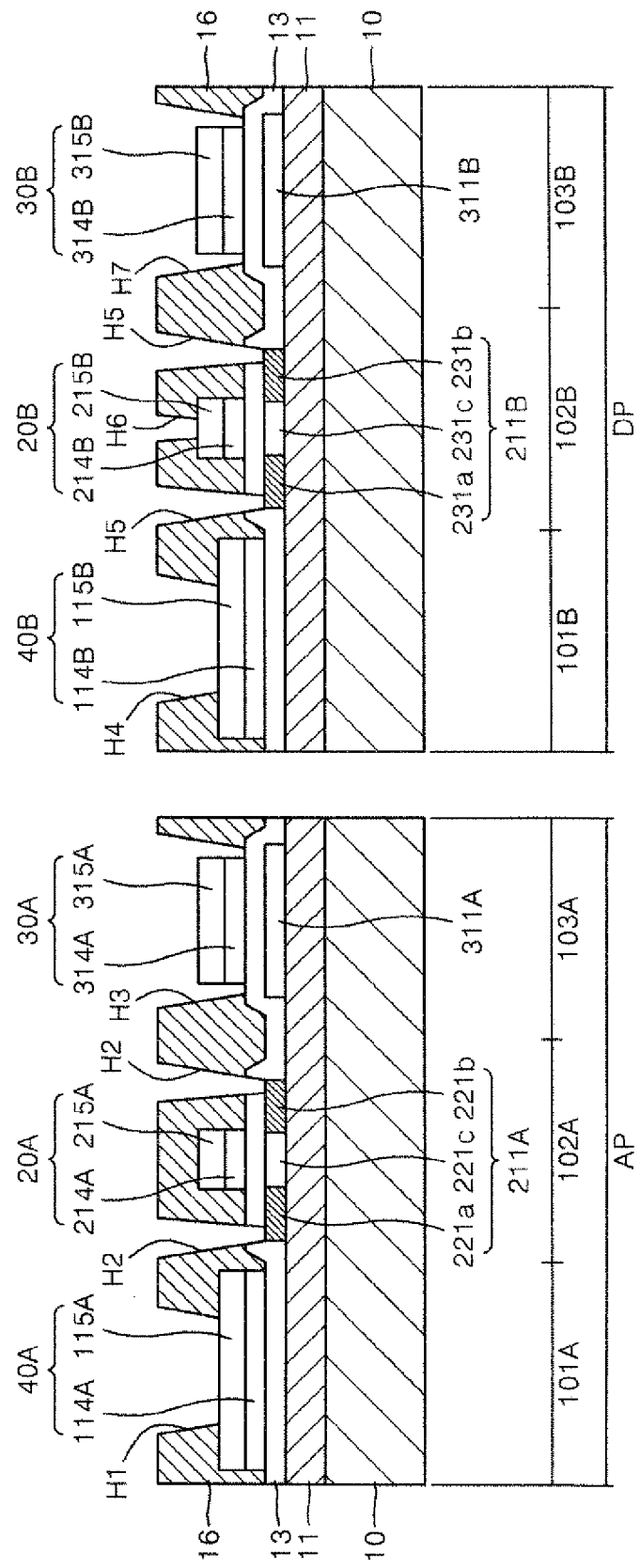

Next, as illustrated in FIG. 7, the second insulating layer 16 is deposited on the electrode patterns 30A, 30B, 40A, and 40B and on the first and second gate electrodes 20A and 20B, the second insulating layer 16 and insulating layers under the second insulating layer 16 are patterned so as to form first to seventh openings H1, H2, H3, H4, H5, H6, and H7.

Thus, a portion of the second insulating layer 16 is removed from the first emission area 101A so that the first opening H1 exposes an upper portion of the first metal layer 115A of the electrode pattern 40A. A portion of the second insulating layer 16 is removed from the second emission area 101B so that the fourth opening H4 exposes an upper portion of the second metal layer 115B of the electrode pattern 40B.

Portions of the second insulating layer 16 and the first insulating layer 13 are removed in the first channel area 102A to form the second opening H2 through which part of the source/drain regions 221a and 221b are exposed. Portions of the second insulating layer 16 and the first insulating layer 13 are removed in the second channel area 102B to form the fifth opening H5 through which part of the source/drain regions 231a and 231b are exposed and to form the sixth opening H6 through which part of the second electrode 215B is exposed.

A portion of the second insulating layer 16 is removed in the first storage area 103A to form the third opening H3 through which the whole electrode pattern 30A is exposed. A portion of the second insulating layer 16 is removed in the second storage area 103B to form the seventh opening H7 through which the whole electrode pattern 30B is exposed. In the present embodiment, the whole electrode patterns 30A and 30B are exposed; however, an opening may be formed so as to expose part of the second electrode layer 315A that corresponds to an upper portion of the electrode pattern 30A and part of the second electrode layer 315B that corresponds to an upper portion of the electrode pattern 30B.

The second insulating layer 16 may be formed of at least one organic insulating material selected from the group consisting of polyimide, polyamide, acryl resin, benzocyclobutene, and phenol resin by using a method, such as spin coating. The second insulating layer 16 is formed to a sufficient thickness and may be formed thicker than the above-described first insulating layer 13, for example, and functions as an interlayer insulating layer between a gate electrode and a source/drain electrode of the first and second thin film transistors TFT1 and TFT2. The second insulating layer 16 may be formed of an inorganic insulating material as well as an organic insulating material or may be formed by alternately using the organic insulating material and the inorganic insulating material.

Figure 8:
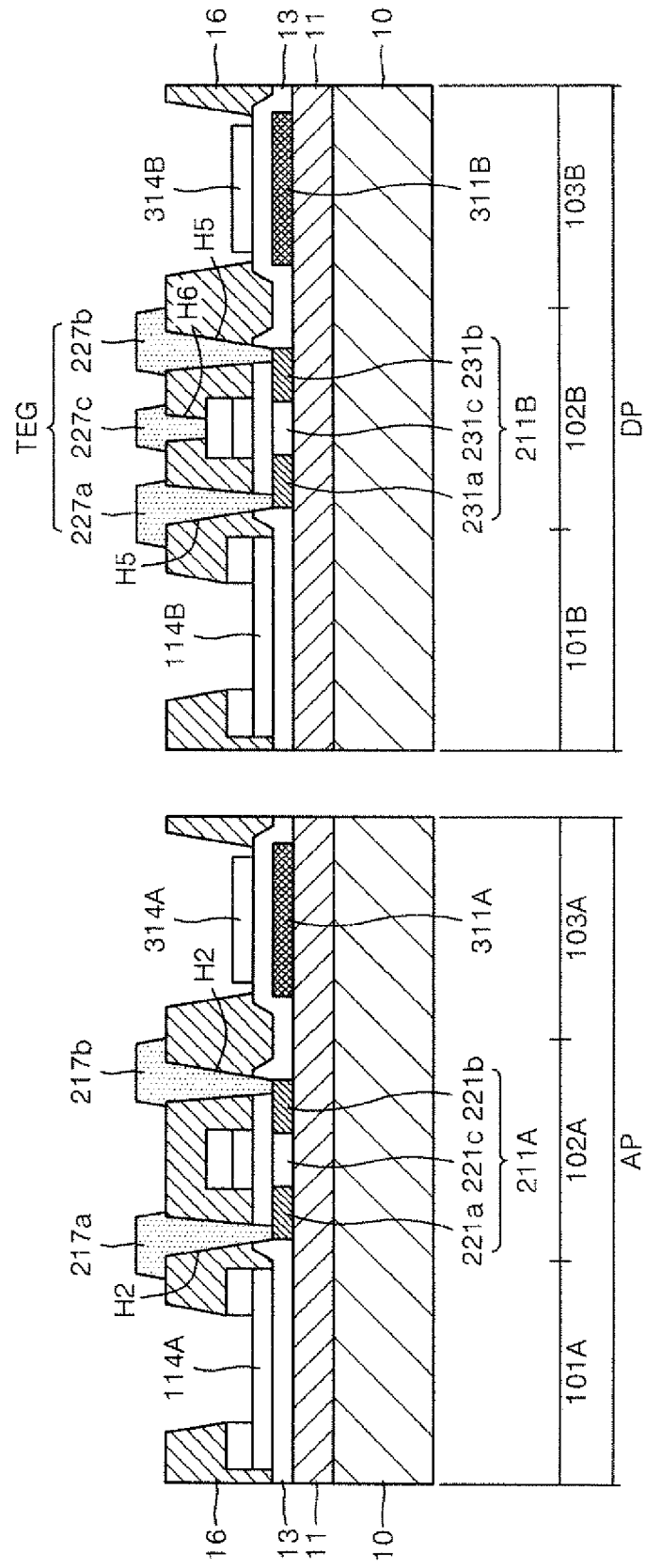

Referring to FIG. 8, after a metal layer is deposited on the entire surface of the substrate 10 by covering the second insulating layer 16, by performing patterning using a mask (not shown), source/drain electrodes 217a and 217b are formed on the available pixels AP, and test element group patterns TEG are formed on the dummy pixels DP.

The metal layer may be formed as a single layer or layers that are formed of at least one metal selected from the same conductive materials as that of the first conductive layer 15. However, aspects of the present invention are not limited thereto, and the metal layer may be formed of various conductive materials.

By performing an etching process simultaneously with the patterning of the metal layer or by performing a subsequent additional etching process, at least part of the first metal layer 115A of the electrode pattern 40A and the second metal layer 115B of the electrode pattern 40B and at least part of the second electrode layer 315A of the electrode pattern 30A and the second electrode layer 315B of the electrode pattern 30B may be removed. Thus, the first pixel electrode 114A and the first capacitor upper electrode 314A of the available pixels AP and the second pixel electrode 114B and the second capacitor upper electrode 314B of the dummy pixels DP are formed. The second pixel electrode 114B is electrically insulated from a first test pattern 227a or a second test pattern 227b.

The source/drain electrodes 217a and 217b that are electrically connected to the source and drain regions 221a and 221b of the first thin film transistor TFT1 via the second opening H2 allow the source/drain regions 221a and 221b of the first thin film transistor TFT1 to be electrically connected to an external device. In this case, one of the source/drain electrodes 217a and 217b is configured to be connected to the first pixel electrode 114A via the first metal layer 115A that is an upper layer of the electrode pattern 40A.

The TEG pattern TEG is formed above the second insulating layer 16.

TEG pattern TEG includes the first test pattern 227a that contacts a source/drain region 231a of the second thin film transistor TFT2 via the fifth opening H5, the second test pattern 227b that contacts the source/drain region 231b of the second thin film transistor TFT2, and a third test pattern 227c that contacts the second electrode 215B of the second gate electrode 20B of the second thin film transistor TFT2 via the sixth opening H6. In this case, the first test pattern 227a or the second test pattern 227b of the TEG pattern TEG is not connected to the second pixel electrode 114B but is insulated from the second pixel electrode 114B and thus is not electrically connected to the second pixel electrode 114B.

The first capacitor lower electrode 311A and the second capacitor lower electrode 311B are doped by injecting n-type or p-type impurities into the first capacitor upper electrode 314A and the second capacitor upper electrode 314B. The n-type or p-type impurities injected during the doping operation may be the same as or different from those used when the first active layer 211A and the second active layer 211B are doped.

By doping the first and second capacitor lower electrodes 311A and 311B, the conductivity of the first and second capacitor lower electrodes 311A and 311B is increased, and accordingly, capacitances of the first and second capacitors (Cst1 and Cst2, FIG. 10) may be increased.

In addition, the third and seventh openings H3 and H7 are formed in the second insulating layer 16 to be larger than the electrode patterns 30A and 30B, respectively. Part of the second conductive layer 15 of the electrode patterns 30A and 30B is etched without leftover portions. Thus, the first and second capacitor lower electrodes 311A and 311B may be completely doped so that improvements in aperture ratio, an increase in capacitances and improvements in quality of signal transmission of capacitor wirings may be achieved.

Figure 9:
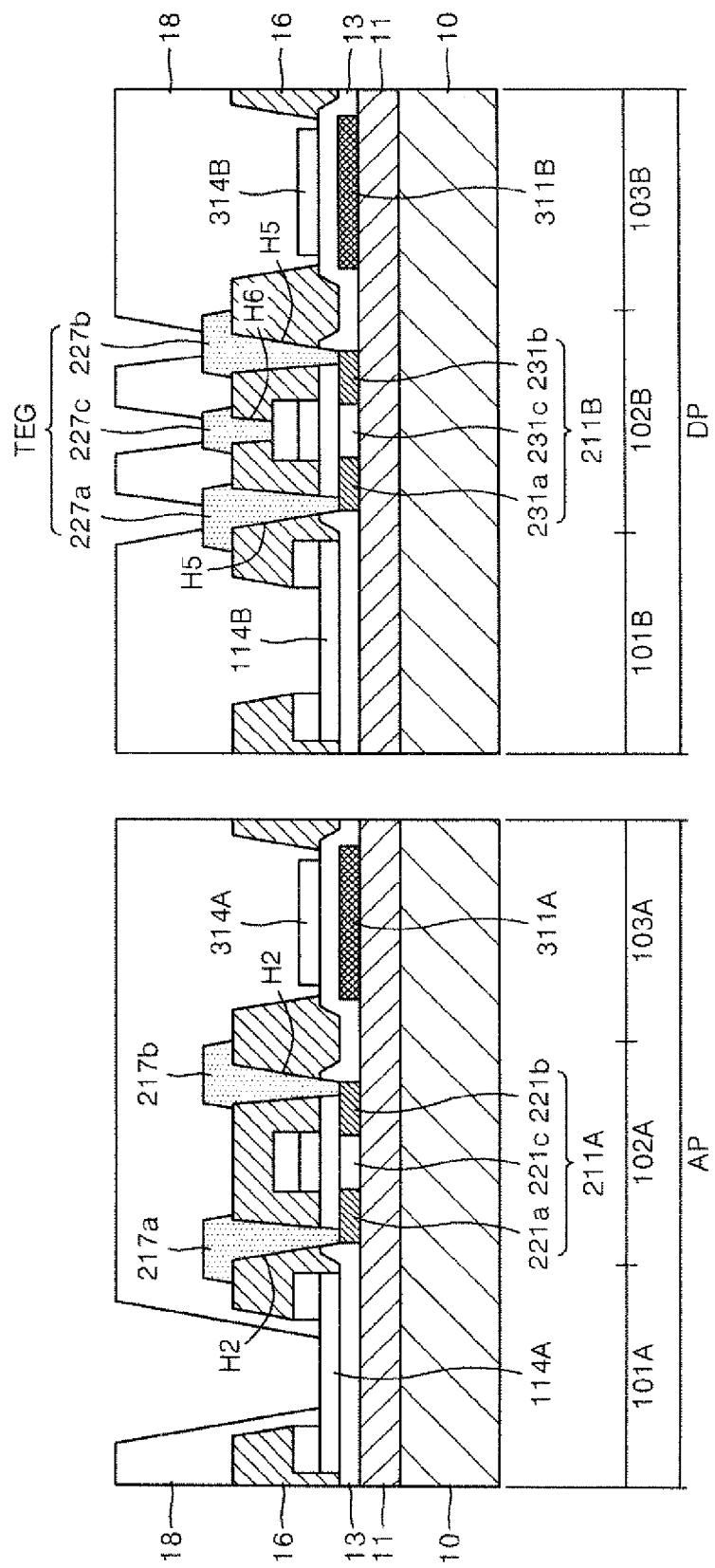

Next, as illustrated in FIG. 9, a third insulating layer 18 is deposited on the entire surface of the substrate 10 on which the source/drain electrodes 217a and 217b and the TEG pattern TEG are formed, and is patterned using a mask process.

Thus, in the available pixels AP, the third insulating layer 18 is patterned so that a pixel-defining layer (PDL) for defining a pixel is formed by exposing part of the first pixel electrode 114A.

In the dummy pixels DP, the third insulating layer 18 is patterned so that part of each of the first through third test patterns 227a, 227b, and 227c of the TEG pattern TEG is exposed. In the dummy pixels DP, the second emission area 101B is not patterned, and the second pixel electrode 114B is covered by the third insulating layer 18 so that the dummy pixels DP do not contribute to emission from the organic light-emitting display panel.

In the case of a TFT substrate of an organic light-emitting display device, all TFTs and capacitors in all areas, excluding an area in which pixel electrodes are formed, are configured to be insulated from each other by an insulating layer, such as a PDL. In this case, the insulating layer needs to be removed using laser, or the like, so as to measure characteristics of a TFT after a TFT process is completed. However, off leakage increases due to overcurrent of the TFT when the insulating layer is removed. Thus, in the present embodiment, the TEG pattern TEG in a probe pin contact area is formed in the second thin film transistor TFT2 of the dummy pixels DP, and the third insulating layer 18 on the TEG pattern TEG is previously removed.

The third insulating layer 18 may be formed of at least one organic insulating material selected from the group consisting of polyimide, polyamide, acryl resin, benzocyclobutene, and phenol resin, or at least one inorganic insulating material selected from the group consisting of $SiO_2$, $SiNx$, $Al_2O_3$, $CuOx$, $Tb_4O_7$, $Y_2O_3$, $Nb_2O_5$, and $Pr_2O_3$. In addition, the third insulating layer 18 may be formed in a multi-layered structure in which an organic insulating material and an inorganic insulating material are alternately used.

Figure 10:
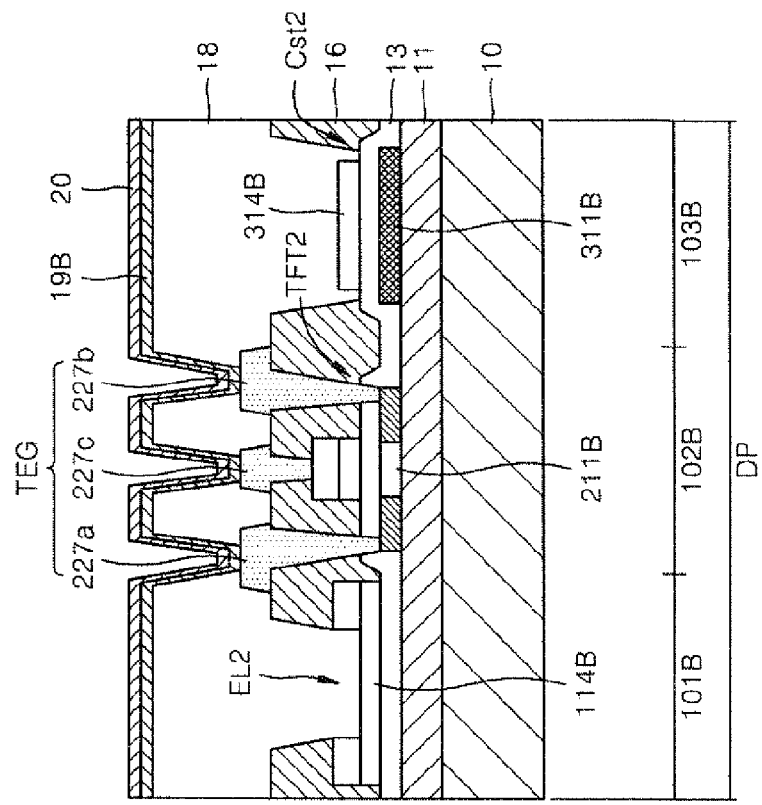
Figure 10:
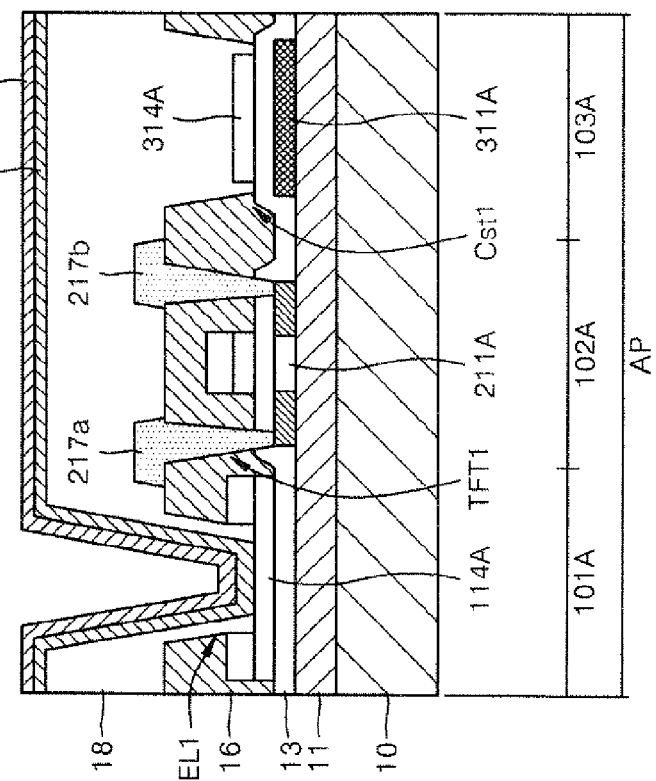

Referring to FIG. 10, intermediate layers 19A and 19B and an opposite electrode 20 are formed on the entire surface of the substrate 10.

The opposite electrode 20 may be deposited on the entire surface of the substrate 10 as a common electrode. In the case of the organic light-emitting display device 1 illustrated in FIG. 1, the first pixel electrode 114A is used as an anode electrode, and the opposite electrode 20 is used as a cathode electrode. Alternatively, polarities of the electrodes described above may be reverse.

The intermediate layer 19A formed on the first pixel electrode 114A of the available pixels AP may have a structure in which an emissive layer (EML) and at least one selected from functional layers, such as a hole transport layer (HTL), a hole injection layer (HIL), an electron transport layer (ETL), and an electron injection layer (EIL) is stacked as a single layer or layers.

When the intermediate layer 19A emits red light, green light, or blue light, the EML may be patterned into a red emissive layer, a green emissive layer, or a blue emissive layer depending on a red sub pixel, a green sub pixel, or a blue sub pixel. On the other hand, when the intermediate layer 19A emits white light, the EML may have a multi-layered structure in which a red emissive layer, a green emissive layer, and a blue emissive layer are stacked, or may have a single layer structure including a red emissive material, a green emissive material, and a blue emissive material, so as to emit white light.

The intermediate layer 19B formed on the TEG pattern TEG of the dummy pixels DP has a structure in which functional layers, excluding an EML, are stacked as a single layer or layers. The EML is excluded from the dummy pixels DP so as to prevent danger of a short-circuit between the second thin film transistor TFT2 as a measurement TFT and the opposite electrode 20.

Figure 11:
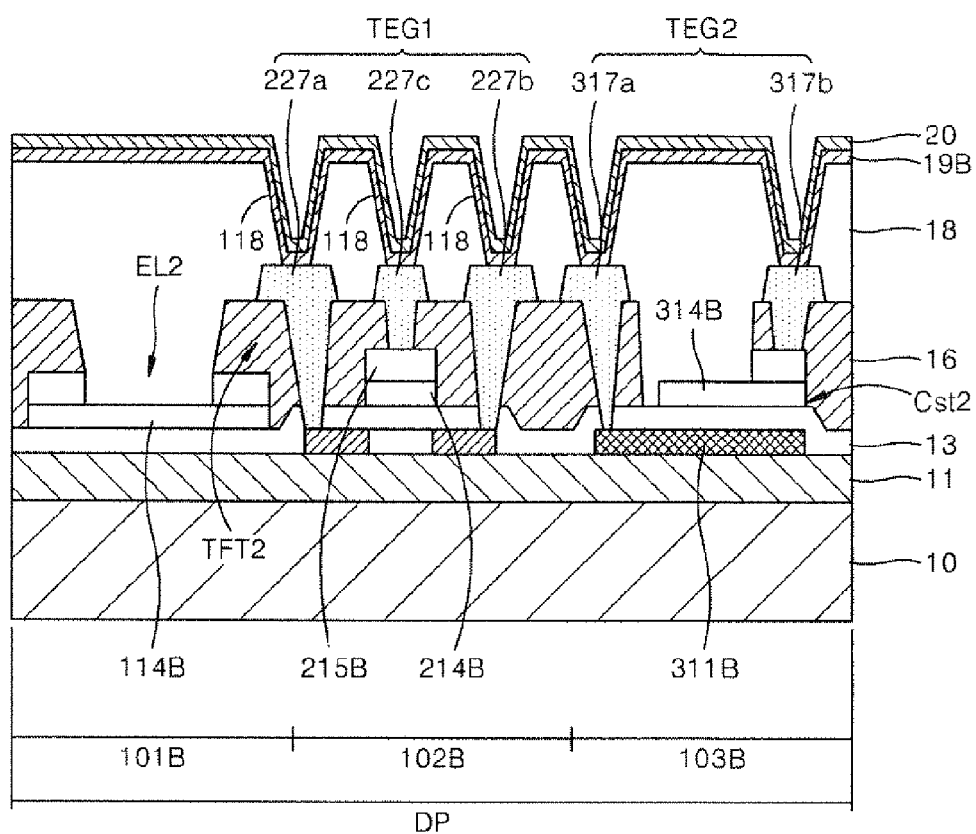
FIG. 11 is a cross-sectional view of dummy pixels of an organic light-emitting display device, according to another embodiment of the present invention.

FIG. 11 is a cross-sectional view of dummy pixels DP of an organic light-emitting display device, according to another embodiment of the present invention.

Referring to FIG. 11, the dummy pixels DP include a first TEG pattern TEG1 that is formed in the second channel area 102B so as to measure characteristics of the second thin film transistor TFT2 and a second TEG pattern TEG2 that is formed in the second storage area 103B so as to measure characteristics of the second capacitor Cst2. The dummy pixels DP illustrated in FIG. 11 are different from the dummy pixels DP illustrated in FIG. 10, by adding the second TEG pattern TEG2 for measuring characteristics of the second capacitor Cst2.

Figure 12:
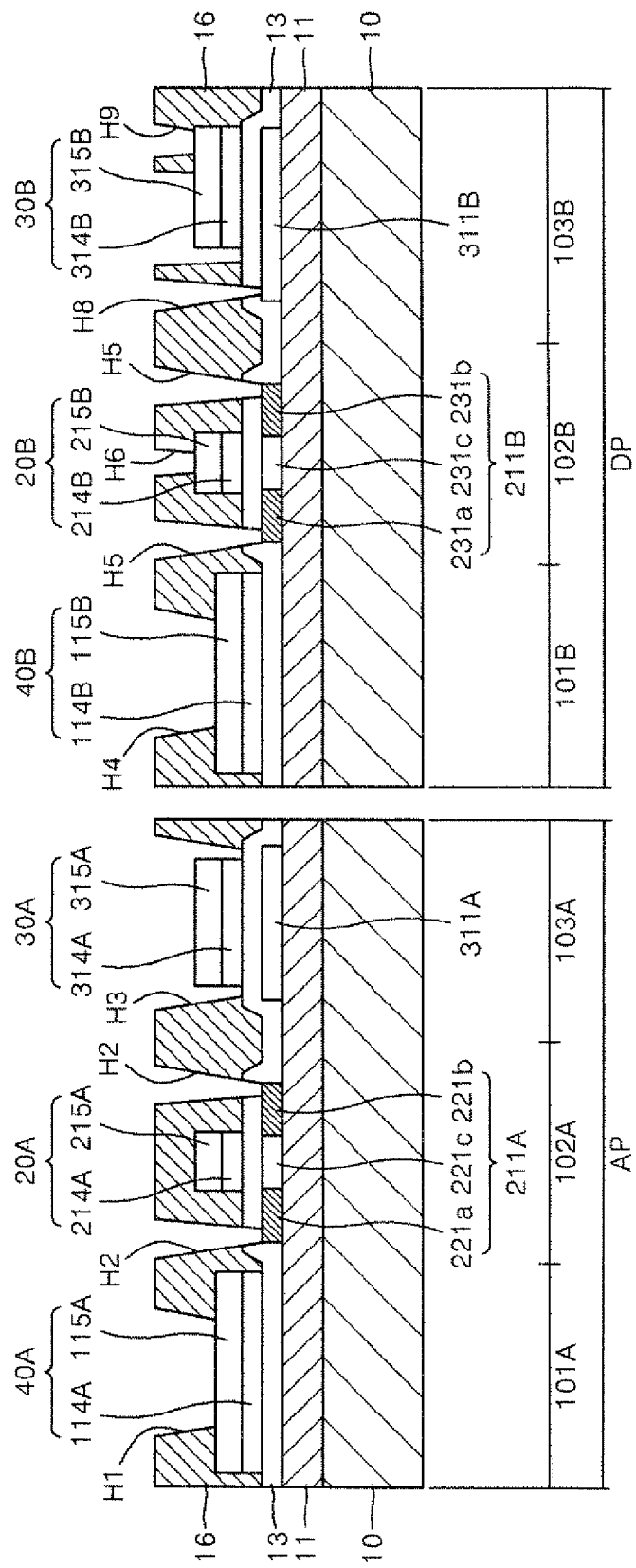
FIGS. 12 through 14 are schematic cross-sectional views of a method of manufacturing the organic light-emitting display device including the dummy pixels illustrated in FIG. 11, according to another embodiment of the present invention.
Figure 13:
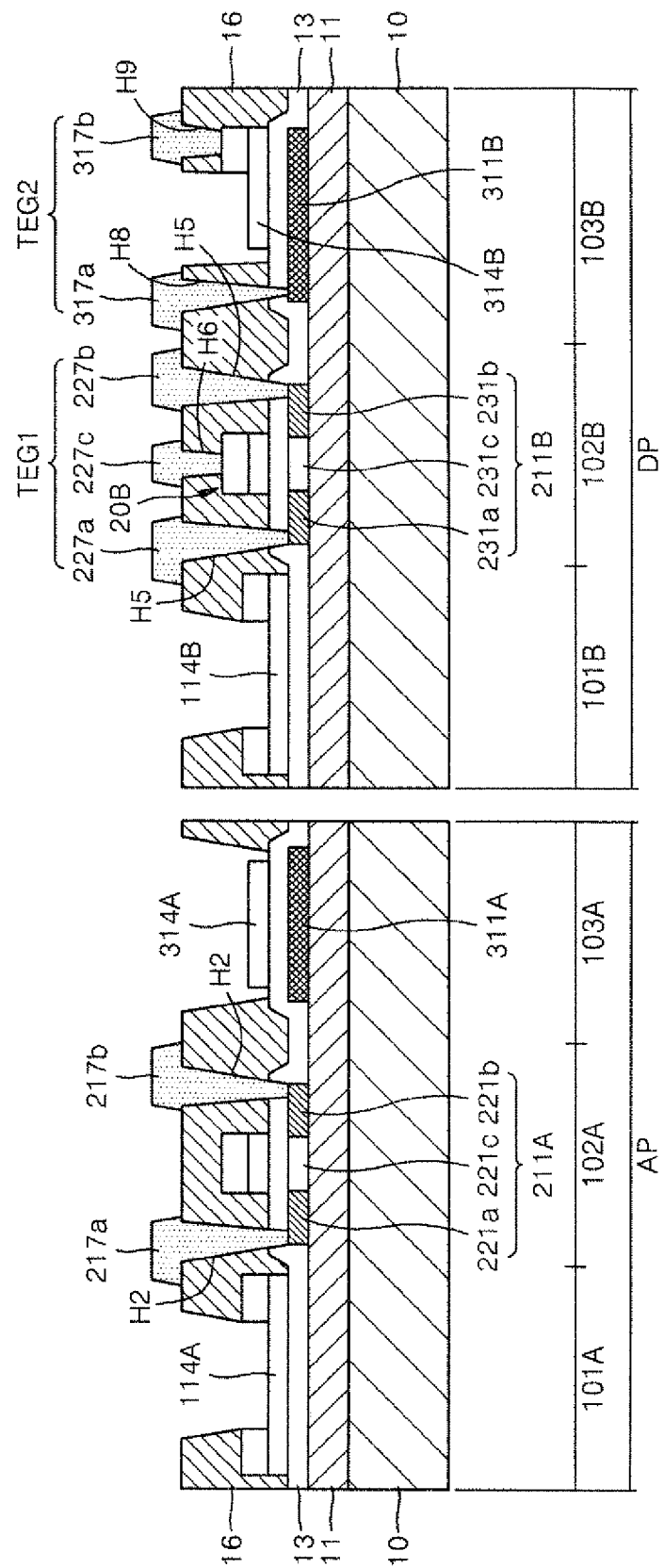
Figure 14:
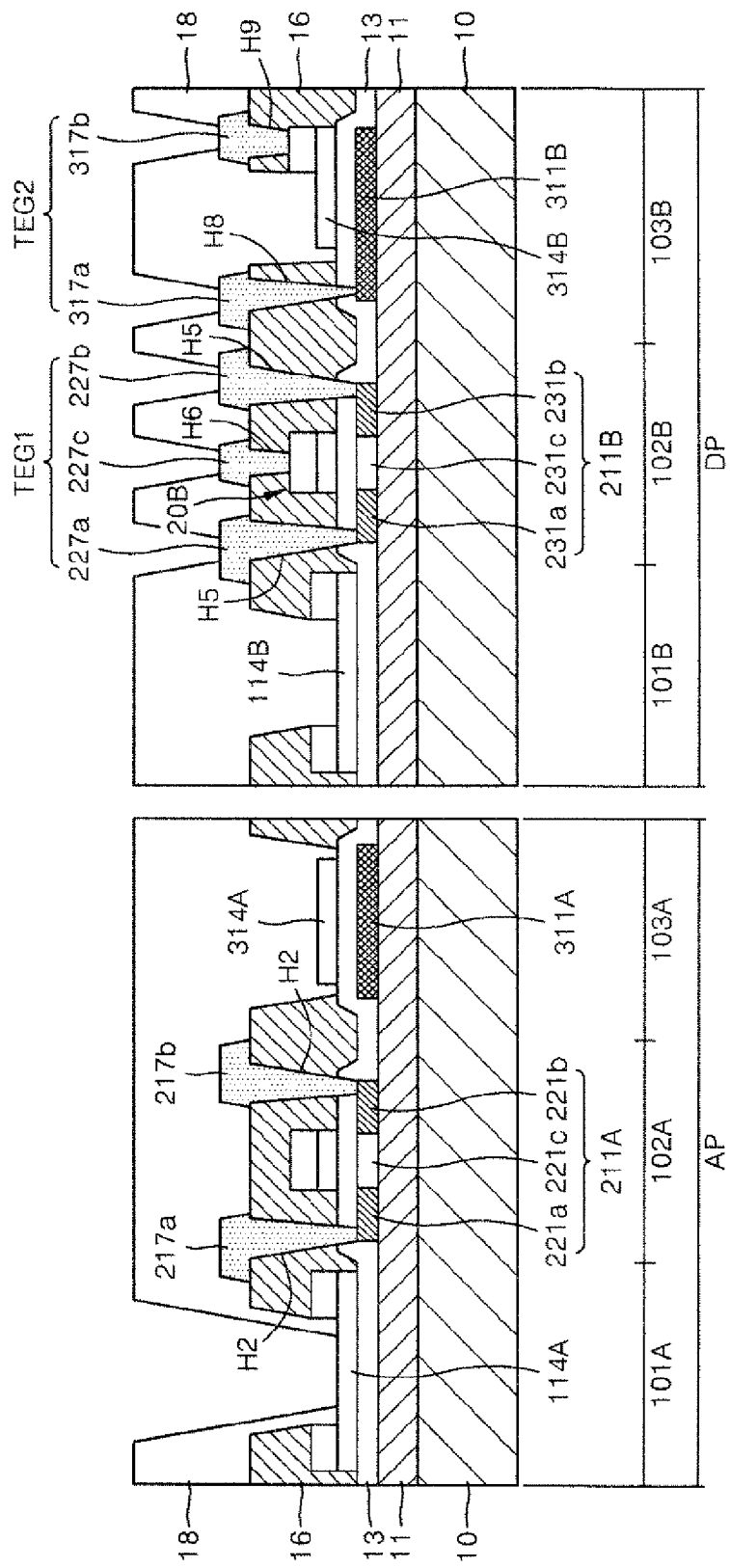

FIGS. 12 through 14 are schematic cross-sectional views of a method of manufacturing the organic light-emitting display device including the dummy pixels DP illustrated in FIG. 11, according to another embodiment of the present invention. Hereinafter, descriptions of the manufacturing process illustrated in FIGS. 4 through 6 that are the same as those of the method of manufacturing the organic light-emitting display device illustrated in FIGS. 4 through 10 are omitted only the difference from the method of FIGS. 4 through 10 is described. For convenience of explanation, like elements denote like reference numerals.

By performing the manufacturing processes of FIGS. 4 through 6, electrode patterns 30A, 30B, 40A, and 40B and first and second gate electrodes 20A and 20B are formed. In this case, part of the electrode patterns 40A and 40B overlap with first and second capacitor lower electrodes 311A and 311B.

As illustrated in FIG. 12, a second insulating layer 16 is deposited on a substrate 10 on which the electrode patterns 30A, 30B, 40A, and 40B and the first and second gate electrodes 20A and 20B are formed, and the second insulating layer 16 and insulating layers under the second insulating layer 16 are patterned so that first to ninth openings H1, H2, H3, H4, H5, H6, H8, and H9 are formed.

Thus, part of the second insulating layer 16 is removed in a first emission area 101A to form the first opening H1 through which a first metal layer 115A that corresponds to an upper portion of the electrode pattern 40A is exposed. Part of the second insulating layer 16 is removed in a second emission area 101B to form the fourth opening H4 through which a second metal layer 115B that corresponds to an upper portion of the electrode pattern 40B is exposed.

Parts of the second insulating layer 16 and the first insulating layer 13 are removed in a first channel area 102A to form the second opening H2 through which part of source/drain regions 221a and 221b is exposed. Parts of the second insulating layer 16 and the first insulating layer 13 are removed in a second channel area 102B to form the fifth opening H5 through which part of source/drain regions 231a and 231b is exposed and the sixth opening H6 through which part of a second electrode 215B of the second gate electrode 20B is exposed.

Part of the second insulating layer 16 is removed in a first storage area 103A to form the third opening H3 through which the whole electrode pattern 30A is exposed. Parts of the second insulating layer 16 and the first insulating layer 13 are removed in the second storage area 103B to form the eighth opening H8 through which part of the second capacitor lower electrode 311B is exposed and the ninth opening H9 through which part of a second electrode layer 315B that corresponds to an upper portion of the electrode pattern 30B is exposed.

The second insulating layer 16 may be formed of an organic or inorganic insulating material, or may be formed by alternately using the organic material and the inorganic insulating material.

Referring to FIG. 13, after a metal layer is deposited on the entire surface of the substrate 10 by covering the second insulating layer 16, by performing patterning using a mask (not shown), source/drain electrodes 217a and 217b are formed on the available pixels AP, and the first TEG pattern TEG1 and the second TEG pattern TEG2 are formed on the dummy pixels DP.

The metal layer may be formed as a single layer or layers that are formed of at least one metal selected from the same conductive materials as that of the first conductive layer 15, and aspects of the present invention are not limited thereto, and the metal layer may be formed of various conductive materials.

By performing an etching process simultaneously with the patterning of the metal layer or by performing a subsequent additional etching process, at least part of the second metal layer 115A of the electrode pattern 40A and the second metal layer 115B of the electrode pattern 40B and at least part of the second electrode layer 315A of the electrode pattern 30A and the second electrode layer 315B of the electrode pattern 30B may be removed. Thus, the first pixel electrode 114A and the first capacitor upper electrode 314A of the available pixels AP and the second pixel electrode 114B and the second capacitor upper electrode 314B of the dummy pixels DP are formed. The second pixel electrode 114B is electrically insulated from a first test pattern 227a or a second test pattern 227b.

The source/drain electrodes 217a and 217b that are electrically connected to the source and drain regions 221a and 221b of the first thin film transistor TFT1 via the second opening H2 allow the source/drain regions 221a and 221b of the first thin film transistor TFT1 to be electrically connected to an external device. In this case, one of the source/drain electrodes 217a and 217b is configured to be connected to the first pixel electrode 114A via the first metal layer 115A that is an upper layer of the electrode pattern 40A.

The first TEG pattern TEG1 is formed above the second insulating layer 16.

The first TEG pattern TEG 1 includes the first test pattern 227a that contacts a source/drain region 231a of the second thin film transistor TFT2 via the fifth opening H5, the second test pattern 227b that contacts the source/drain region 231b of the second thin film transistor TFT2, and a third test pattern 227c that contacts the second electrode 215B of the second gate electrode 20B of the second thin film transistor TFT2 via the sixth opening H6. In this case, the first test pattern 227a or the second test pattern 227b of the first TEG pattern TEG1 is not connected to the second pixel electrode 114B but is insulated from the second pixel electrode 114B and thus is not electrically connected to the second pixel electrode 114B.

The second TEG pattern TEG2 is formed above the second insulating layer 16.

The second TEG pattern TEG2 includes a fourth test pattern 317a that contacts the second capacitor lower electrode 311B of the second capacitor Cst2 via the eighth opening H8 and a fifth test pattern 317b that contacts the second electrode layer 315B of the second capacitor Cst2 via the ninth opening H9 and that is connected to the second capacitor upper electrode 314B.

The first capacitor lower electrode 311A and the second capacitor lower electrode 311B are doped by injecting n-type or p-type impurities into the first capacitor upper electrode 314A and the second capacitor upper electrode 314B. The n-type or p-type impurities injected during the doping operation may be the same as or different from those used when the first active layer 211A and the second active layer 211B are doped.

By doping the first and second capacitor lower electrodes 311A and 311B, the conductivity of the first and second capacitor lower electrodes 311A and 311B is increased, and accordingly, capacitances of the first and second capacitors Cst1 and Cst2 may be increased.

Next, as illustrated in FIG. 14, a third insulating layer 18 is deposited on the entire surface of the substrate 10 on which the source/drain electrodes 217a and 217b and the first and second TEG patterns TEG1 and TEG2 are formed, and is patterned using a mask process.

Thus, in the available pixels AP, the third insulating layer 18 is patterned so that a pixel defining layer (PDL) for defining a pixel is formed by exposing part of the first pixel electrode 114A.

In the dummy pixels DP, the third insulating layer 18 is patterned so that part of each of the first through third test patterns 227a, 227b, and 227c of the first TEG pattern TEG1 and part of each of the fourth and fifth test patterns 317a and 317b of the second TEG pattern TEG2 are exposed. In the dummy pixels DP, the second emission area 101B is not patterned, and the second pixel electrode 114B is covered by the third insulating layer 18 so that the dummy pixels DP do not contribute to emission from the organic light-emitting display panel.

In the present embodiment, the first TEG pattern TEG1 and the second TEG pattern TEG2 in a probe pin contact area are formed in the second thin film transistor TFT2 and the second capacitor Cst2 of the dummy pixels DP, respectively, and the third insulating layer 18 on the first TEG pattern TEG1 and the second TEG pattern TEG2 is previously removed. Thus, problems related to a leakage increase that occurs when an insulating layer for measuring characteristics of a thin film transistor and a capacitor is removed after thin film transistor and capacitor processes are completed may be prevented.

The third insulating layer 18 may be formed of an organic or inorganic insulating material, or may be formed in a multi-layered structure in which an organic insulating material and an inorganic insulating material are alternately used.

Subsequently, as shown in FIG. 10, intermediate layers 19A and 19B, and an opposite electrode 20 are formed on the entire surface of the substrate 10.

In this case, the intermediate layer 19A formed on the first pixel electrode 114A of the available pixels AP may have a structure in which an emissive layer (EML) and at least one selected from functional layers, such as a hole transport layer (HTL), a hole injection layer (HIL), an electron transport layer (ETL), and an electron injection layer (EIL) is stacked as a single layer or layers.

The intermediate layer 19B formed on the first and second TEG patterns TEG1 and TEG2 of the dummy pixels DP has a structure in which functional layers, excluding an EML, are stacked as a single layer or layers. The EML is excluded from the dummy pixels DP so as to prevent danger of a short-circuit between the second thin film transistor TFG2 as a measurement TFT, the second capacitor Cst2 and the opposite electrode 20.

Figure 15:
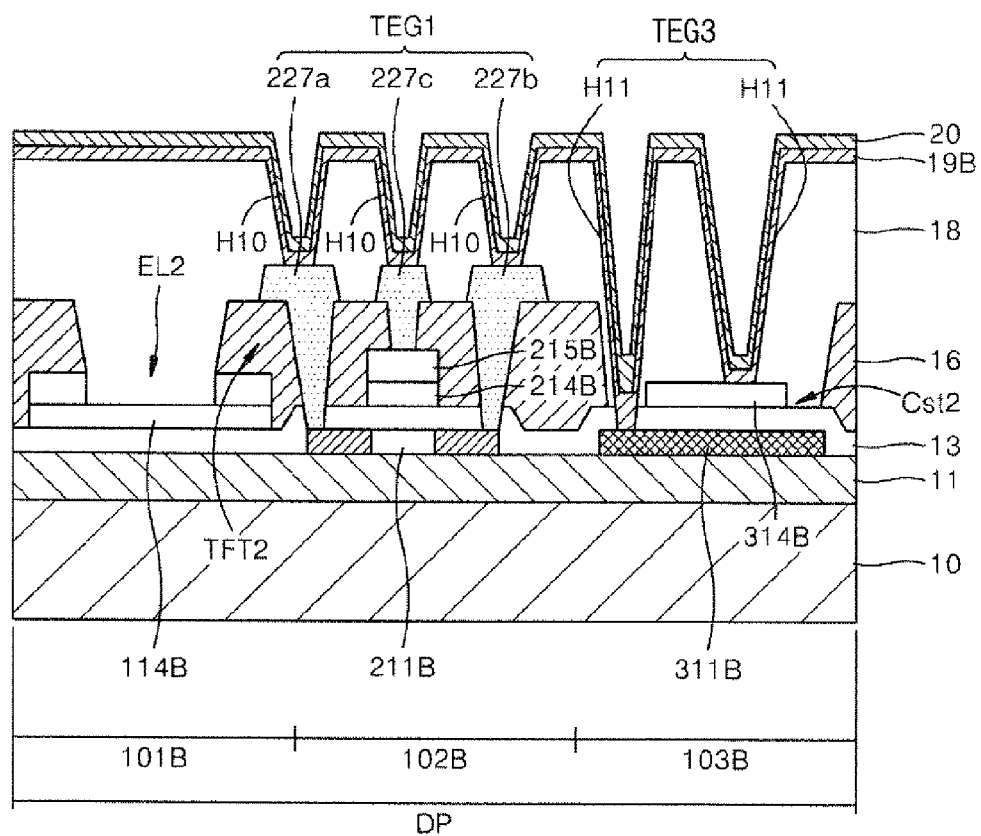
FIG. 15 is a cross-sectional view of dummy pixels of an organic light-emitting display device, according to another embodiment of the present invention.

FIG. 15 is a cross-sectional view of dummy pixels DP of an organic light-emitting display device, according to another embodiment of the present invention. Although not shown, available pixels AP are the same as the available pixels AP included in the organic light-emitting display device illustrated in FIGS. 1 through 14.

Referring to FIG. 15, since a third TEG pattern TEG3 of the dummy pixels DP is an opening pattern formed through eleventh openings H11 that are formed by removing part of insulating layers to expose the second capacitor lower electrode 311B and the second capacitor upper electrode 314B, the third TEG pattern TEG3 of the dummy pixels DP of FIG. 15 is different from the second TEG pattern TEG2 of the dummy pixels DP illustrated in FIG. 14.

In the dummy pixels DP, as shown in FIG. 15, the third insulating layer 18 is patterned to form tenth openings H10 through which part of each of first through third test patterns 227a, 227b, and 227c of the first TEG pattern TEG1 in a second channel area 102B is exposed, and to form the eleventh openings H11 through which parts of the second capacitor lower electrode 311B and the second capacitor upper electrode 314B of the second capacitor Cst2 in a second storage area 103B are exposed. An opening pattern that is formed by the eleventh openings H11 with respect to the second capacitor lower electrode 311B and the second capacitor upper electrode 314B is the third TEG pattern TEG3.

Next, an intermediate layer 19B that is formed on the first TEG pattern TEG1 and third TEG pattern TEG3 of the dummy pixels DP has a structure in which functional layers, excluding an EML, are stacked as a single layer or layers. The EML is excluded from the dummy pixels DP so as to prevent danger of a short-circuit between each of the second thin film transistor TFT2 as a measurement TFT and the second capacitor Cst2 and the opposite electrode 20.

In order to monitor electrical characteristics regarding smears formed by crystallization, when the available pixels AP are formed, the dummy pixels DP for testing characteristics of a thin film transistor and/or a capacitor are formed. In an operation of forming a PDL by patterning insulating layers in the available pixels AP, the insulating layers that cover the TEG pattern of the dummy pixels DP are removed.

Thus, a characteristic test may be performed later by removing only functional layers that cover the TEG pattern of the dummy pixels DP and the opposite electrode. Thus, the characteristic test may be easily performed, and simultaneously, problems related to leakage that occurs when insulating layers that cover the thin film transistor and the capacitor are removed may be prevented so that a precise test may be performed.

In the above-described embodiments, an organic light-emitting display device has been described. However, aspects of the present invention are not limited thereto, and alternatively, various display devices including a liquid crystal display (LCD) device may be used.

Although one TFT and one capacitor are shown in the drawings for explaining the embodiments of the present invention, this is just for convenience of explanation, and aspects of the present invention are not limited thereto. Alternatively, a plurality of TFTs and a plurality of capacitors may be provided as long as the number of mask processes according to the present invention is not increased.

By forming the dummy pixels, a characteristic test of a TFT and a capacitor can be easily and precisely performed so that the result of the characteristic test is reliable.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light-emitting display device comprising:
available pixels disposed in a first arrangement for displaying an image by light emission; and
dummy pixels disposed in a second arraignment different from the first arrangement around the available pixels for measuring characteristics of the available pixels, each dummy pixel comprising:
an active layer comprised of polycrystalline silicon that is formed by patterning a semiconductor layer formed by laser crystallization, the active layer including a channel area and source and drain regions disposed on opposite sides of the channel area;
a gate electrode that is disposed to correspond to the channel area of the active layer;
a first insulating layer that is disposed between the active layer and the gate electrode;
a second insulating layer that is disposed on the gate electrode; and
a test element group pattern including at least first, second and third test patterns that are formed on the second insulating layer and contact the source region, the drain region and the gate electrode, respectively.

2. The organic light-emitting display device of claim 1, further comprising:
a third insulating layer which is disposed on the second insulating layer by covering the first, second and third test patterns and in which a first plurality of holes for exposing parts of the first, second and third test patterns are formed;
an intermediate layer formed in, but not filling, the first plurality of holes; and
an electrode layer formed on the intermediate layer.

3. The organic light-emitting display device of claim 1, the intermediate layer having a structure in which functional layers, excluding an emissive layer (EML), are stacked as a single layer or layers.

4. The organic light-emitting display device of claim 2, further comprising a pixel electrode that is formed on the first insulating layer and is covered by the third insulating layer.

5. The organic light-emitting display device of claim 2, further comprising:
a capacitor lower electrode that is formed by patterning the semiconductor layer on a same layer as the active layer; and
a capacitor upper electrode that is formed on the first insulating layer and is covered by the third insulating layer.

6. The organic light-emitting display device of claim 5, further comprising:
a second test element group pattern including at least fourth and fifth test patterns, the fourth and fifth test patterns are formed on the second insulating layer and contact part of the capacitor lower electrode and part of an electrode layer that contacts the capacitor upper electrode, respectively,
the third insulating layer comprising a second plurality of holes through which parts of the fourth and fifth test patterns are exposed, and the intermediate layer and the electrode layer are sequentially stacked in, but not filling, the holes.

7. The organic light-emitting display device of claim 5, the third insulating layer comprising a second plurality of holes through which parts of the capacitor lower electrode and part of the capacitor upper electrode are exposed, and the intermediate layer and the electrode layer are sequentially stacked in, but not filling, the holes.

8. An organic light-emitting display device comprising:
available pixels for displaying an image by light emission, and dummy pixels disposed around the available pixels for measuring characteristics of the available pixels, and
each available pixel comprising a first active layer comprised of polycrystalline silicon formed by patterning a semiconductor layer formed by laser crystallization, a first gate electrode disposed to correspond to a channel area of the first active layer, and source and drain electrodes that contact source and drain regions of the first active layer and disposed on opposite sides of the channel area, respectively; and
each dummy pixel comprising a second active layer formed by patterning the semiconductor layer, a second gate electrode disposed to correspond to a channel area of the second active layer, source and drain regions disposed on opposite sides of the channel area of the second active layer and a test element group pattern including at least first, second and third test patterns that contact the source region of the second active layer, the drain region of the second active layer and the second gate electrode, respectively.

9. The organic light-emitting display device of claim 8, further comprising:

a first insulating layer that is disposed between the first active layer and the first gate electrode and between the second active layer and the second gate electrode;

a second insulating layer that is disposed between the first gate electrode and the source and drain electrodes and between the second gate electrode and the first, second and third test patterns; and a third insulating layer which is disposed on the second insulating layer by covering the source and drain electrodes and the first, second and third test patterns and in which a first plurality of holes are formed to expose parts of the first, second and third test patterns.

10. The organic light-emitting display device of claim 9, further comprising:

an intermediate layer that is formed on the third insulating layer; and an electrode layer that is formed on the intermediate layer.

11. The organic light-emitting display device of claim 10, each of the available pixels further comprising a first pixel electrode that is formed on the first insulating layer, and in the available pixels, the intermediate layer and the electrode layer are sequentially formed on the first pixel electrode that is exposed by patterning the third insulating layer, and each of the dummy pixels further comprises a second pixel electrode that is formed on the first insulating layer and is covered by the third insulating layer.

12. The organic light-emitting display device of claim 11, the intermediate layer formed on the available pixels having a structure in which an emissive layer (EML) and functional layers are stacked as a single layer or layers, and the intermediate layer formed on the dummy pixels has a structure in which functional layers, excluding the EML, are stacked as a single layer or layers.

13. The organic light-emitting display device of claim 10, each of the available pixels further comprising a first capacitor lower electrode that is formed by patterning the semiconductor layer on a same layer as the first active layer and a first capacitor upper electrode that is formed on the first insulating layer and is covered by the third insulating layer, and each of the dummy pixels further comprises a second capacitor lower electrode that is formed by patterning the semiconductor layer on a same layer as the second active layer and a second capacitor upper electrode that is formed on the first insulating layer and is covered by the third insulating layer.

14. The organic light-emitting display device of claim 13, the test element group pattern further comprising fourth and fifth test patterns that are formed on the second insulating layer and contact part of the second capacitor lower electrode and part of an electrode layer that contacts the second capacitor upper electrode, respectively, the third insulating layer comprising a second plurality of holes through which parts of the fourth and fifth test patterns are exposed, and the intermediate layer and the electrode layer are sequentially stacked in, but not filling, the holes.

15. The organic light-emitting display device of claim 13, the third insulating layer comprising a second plurality of holes through which parts of the second capacitor lower electrode and part of the second capacitor upper electrode are exposed, and the intermediate layer and the electrode layer are sequentially stacked in, but not filling, the second plurality of holes.

* * * * *